United States Patent
Drege et al.

(10) Patent No.: US 7,523,076 B2
(45) Date of Patent: Apr. 21, 2009

(54) SELECTING A PROFILE MODEL FOR USE IN OPTICAL METROLOGY USING A MACHINE LEARNING SYSTEM

(75) Inventors: Emmanuel Drege, San Jose, CA (US); Srinivas Doddi, Fremont, CA (US); Junwei Bao, Santa Clara, CA (US)

(73) Assignee: Tokyo Electron Limited, Tokyo (JP)

( * ) Notice: Subject to any disclaimer, the term of this patent is extended or adjusted under 35 U.S.C. 154(b) by 276 days.

(21) Appl. No.: 10/791,046

(22) Filed: Mar. 1, 2004

(65) Prior Publication Data
US 2005/0192914 A1    Sep. 1, 2005

(51) Int. Cl.
*G06F 15/18* (2006.01)
(52) U.S. Cl. .............................. 706/12; 706/14; 706/46
(58) Field of Classification Search .................... 706/12
See application file for complete search history.

(56) References Cited

U.S. PATENT DOCUMENTS

| | | | |
|---|---|---|---|
| 5,479,573 | A | 12/1995 | Keeler et al. |
| 5,793,480 | A | 8/1998 | Lacey et al. |
| 5,889,593 | A | 3/1999 | Bareket |
| 6,023,327 | A | 2/2000 | Shabde et al. |
| 6,192,103 | B1 | 2/2001 | Wormington et al. |
| 6,609,086 | B1 | 8/2003 | Bao et al. |
| 6,633,831 | B2 | 10/2003 | Nikoonahad et al. |
| 6,650,422 | B2 | 11/2003 | Singh et al. |
| 6,657,736 | B1 | 12/2003 | Finarov et al. |
| 6,665,446 | B1 | 12/2003 | Kato |
| 6,704,661 | B1 | 3/2004 | Opsal et al. |
| 6,771,356 | B1 | 8/2004 | Lyons et al. |
| 6,782,337 | B2 | 8/2004 | Wack et al. |
| 6,785,638 | B2 | 8/2004 | Niu et al. |
| 6,943,900 | B2 | 9/2005 | Niu et al. |
| 6,999,254 | B1 | 2/2006 | Phan et al. |

(Continued)

FOREIGN PATENT DOCUMENTS

EP    0448890 A1    10/1991

OTHER PUBLICATIONS

Gahegan, M. et al. (1999). "Dataspaces as an Organizational Concept for the Neural Classification of Geographic Datasets," GeoComputation, located at <http://www.geovista.psu.edu/sites/geocomp99/Gc99/011/gc_011.htm> visited on Aug. 14, 2007, (8 pages).

(Continued)

*Primary Examiner*—Joseph P Hirl
(74) *Attorney, Agent, or Firm*—Morrison & Foerster LLP

(57) ABSTRACT

A profile model can be selected for use in examining a structure formed on a semiconductor wafer using optical metrology by obtaining an initial profile model having a set of profile parameters. A machine learning system is trained using the initial profile model. A simulated diffraction signal is generated for an optimized profile model using the trained machine learning system, where the optimized profile model has a set of profile parameters with the same or fewer profile parameters than the initial profile model. A determination is made as to whether the one or more termination criteria are met. If the one or more termination criteria are met, the optimized profile model is modified and another simulated diffraction signal is generated using the same trained machine learning system.

47 Claims, 5 Drawing Sheets

U.S. PATENT DOCUMENTS

| | | | |
|---|---|---|---|
| 7,043,397 B2 | 5/2006 | Johnson | |
| 7,072,049 B2 | 7/2006 | Niu et al. | |
| 7,126,700 B2 | 10/2006 | Bao et al. | |
| 7,158,896 B1 | 1/2007 | Singh et al. | |
| 7,186,650 B1 | 3/2007 | Dakshina-Murthy | |
| 7,224,456 B1 | 5/2007 | Phan et al. | |
| 7,280,229 B2 | 10/2007 | Li et al. | |
| 2003/0225535 A1* | 12/2003 | Doddi et al. | 702/76 |
| 2004/0017574 A1* | 1/2004 | Vuong et al. | 356/625 |
| 2004/0017575 A1* | 1/2004 | Balasubramanian et al. | 356/625 |
| 2004/0267397 A1* | 12/2004 | Doddi et al. | 700/110 |
| 2005/0057748 A1* | 3/2005 | Vuong et al. | 356/237.5 |
| 2005/0088665 A1* | 4/2005 | Bischoff et al. | 356/601 |
| 2005/0209816 A1 | 9/2005 | Vuong et al. | |
| 2006/0224528 A1 | 10/2006 | Liu et al. | |
| 2007/0185684 A1 | 8/2007 | Vuong et al. | |

OTHER PUBLICATIONS

Haykin, S. (1999). *Neural Networks*. 2nd edition, M. Horton ed., Prentice Hall: Upper Saddle River, New Jersey, 9 pages (Table of Contents).

International Search Report mailed May 16, 2005, for PCT Application No. PCT/US04/20682 filed Jun. 25, 2004, 2 pages.

Press, W. H. et al. (1992). *Numerical Recipes in C: The Art of Scientific Computing*. Cambridge University Press, 2nd edition, 8 pages (Table of Contents).

Vapnik, V. N. (1998). *Statistical Learning Theory*. John Wiley & Sons, Inc., 15 pages (Table of Contents).

Arthur, G. G. et al. (1997). "Enhancing the Development Rate Model for Optimum Simulation Capability in the Subhalf-Micron Regime," *Proceedings of SPIE* 3049:189-200.

Brooks, R. A. (1999). "How to Build Complete Creatures Rather than Isolated Cognitive Simulators," MIT, Artificial Intelligence Laboratory, 7 pages, located at <http://people.csail.mit.edu/brooks/papers/how-to-build.pdf>.

Del Jesus, M. J. et al. (Jun. 2004). "Induction of Fuzzy-Rule-Based Classifiers with Evolutionary Boosting Algorithms," *IEEE Transactions on Fuzzy Systems* 12(3):296-308.

Dietterich, T. G. (1997). Machine Learning Research: Four Current Directions, *Al Magazine*, pp. 97-136, located at <http://pages.cs.wisc.edu/~shavlik/Dietterich_AlMag18-04-010.pdf>.

Goodridge, S. G. et al. (May 8-13, 1994). "Fuzzy Behavior Fusion for Reactive Control of an Autonomous Mobile Robot: MARGE," *IEEE International Conference on Robotics and Automation*, San Diego, CA, 2:1622-1627.

Horswill, I. D. (2000). "Conflict Resolution," Northwestern University, Computer Science 395 Behavior-Based Robotics, 10 pages, located at <www.cs.northwestern.edu/academics/courses/special_topics/395-robotics/conflict-resolution.pdf>.

Horswill, I. D. (2000). "Functional Programming of Behavior-Based Systems," Northwestern University, Computer Science Department and The Institute for the Learning Sciences, 11 pages, <www.cs.northwestern.edu/~ian/grl-paper.pdf>.

Keeman, V. (2005). "Support Vector Machine—An Introduction" *In Support Vector Machines: Theory and Applications*. Wang, L. ed., Springer-Verlag Berlin Heidelberg: The Netherlands, pp. 1-47.

Platt, J. C. (1999). "Fast Training of Support Vector Machines Using Sequential Minimal Optimization" Chapter 12 *In Advances in Kernal methods: Support Vector Learning*. Schölkopf et al. eds., MIT Press: Cambridge, MA, pp. 185-208.

Rowe, N. C. (1990). "Plan Fields and Real-World Uncertainty," *AAAI Spring Symposium on Planning in Uncertain, Unpredictable, or Changing Environments*, located at <http://www.nps.navy.mil/Content/CS/ncrowe/symp90un.html> visited on Oct. 18, 2007, (4 pages).

Sarkar. M. (Oct. 8-11, 2000). "Modular Pattern Classifiers: A Brief Survey," *IEEE International Conference On Systems, Man & Cybernetics*, Nashville, TN, 4:2878-2883.

U.S. Appl. No. 11/729,498, filed Mar. 28, 2007 for Bishoff et al.

U.S. Appl. No. 11/786,869, filed Apr. 12, 2007 for Jin et al.

U.S. Appl. No. 11/786,870, filed Apr. 12, 2007 for Jin et al.

U.S. Appl. No. 11/787,025, filed Apr. 12, 2007 for Jin et al.

Van Halteren, H. et al. (Jun. 2001), "Improving Accuracy in World Class Tagging Through Combination of Machine Learning Systems," *Computational Linguistics* 27(2):199-229.

* cited by examiner

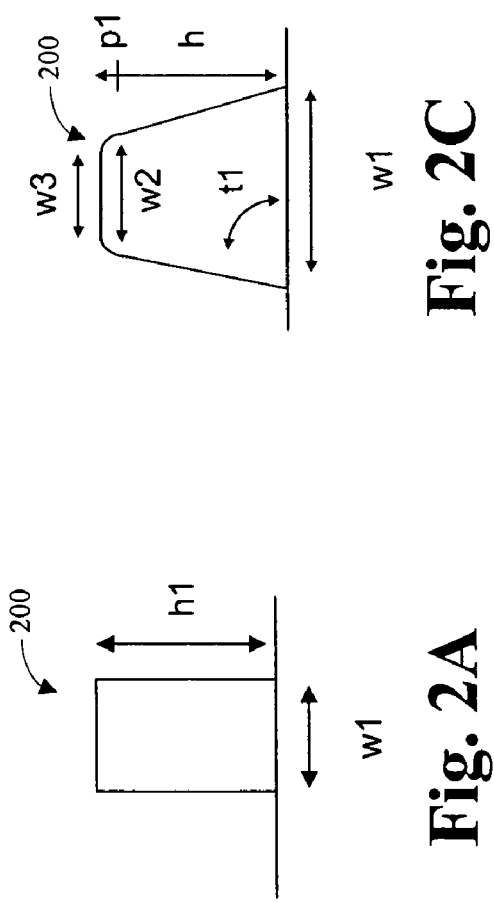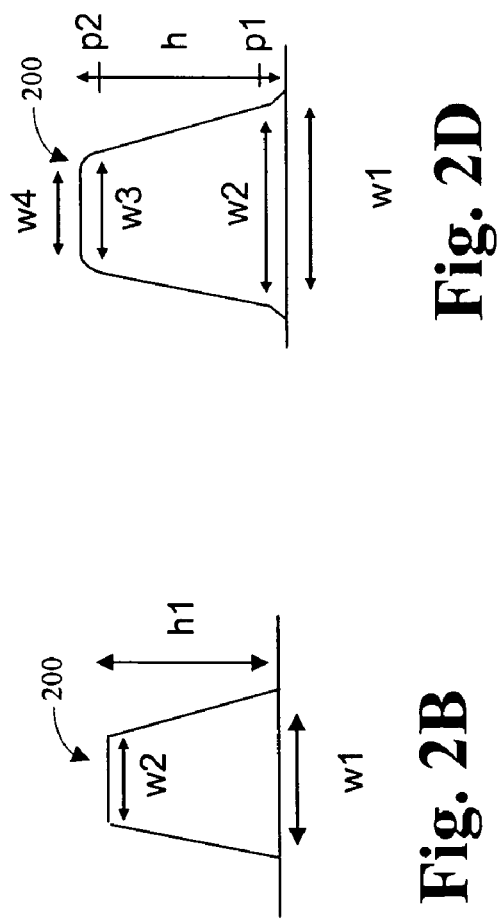

SELECTING A PROFILE MODEL FOR USE IN OPTICAL METROLOGY USING A MACHINE LEARNING SYSTEM

BACKGROUND

1. Field of the Invention

The present application relates to metrology of structures formed on semiconductor wafers, and more particularly to selecting a profile model for use in optical metrology using a machine learning system.

2. Related Art

Optical metrology involves directing an incident beam at a structure, measuring the resulting diffracted beam, and analyzing the diffracted beam to determine a feature of the structure. In semiconductor manufacturing, optical metrology is typically used for quality assurance. For example, after fabricating a periodic grating in proximity to a semiconductor chip on a semiconductor wafer, an optical metrology system is used to determine the profile of the periodic grating. By determining the profile of the periodic grating, the quality of the fabrication process utilized to form the periodic grating, and by extension the semiconductor chip proximate the periodic grating, can be evaluated.

One conventional optical metrology system uses a diffraction modeling technique, such as rigorous coupled wave analysis (RCWA), to analyze the diffracted beam. More particularly, in the diffraction modeling technique, a model diffraction signal is calculated based, in part, on solving Maxwell's equations. Calculating the model diffraction signal involves performing a large number of complex calculations, which can be time consuming and costly.

SUMMARY

In one exemplary embodiment, a profile model can be selected for use in examining a structure formed on a semiconductor wafer using optical metrology by obtaining an initial profile model having a set of profile parameters. A machine learning system is trained using the initial profile model. A simulated diffraction signal is generated for an optimized profile model using the trained machine learning system, where the optimized profile model has a set of profile parameters with the same or fewer profile parameters than the initial profile model. A determination is made as to whether the one or more termination criteria are met. If the one or more termination criteria are met, the optimized profile model is modified and another simulated diffraction signal is generated using the same trained machine learning system.

DESCRIPTION OF DRAWING FIGURES

The present invention can be best understood by reference to the following description taken in conjunction with the accompanying drawing figures, in which like parts may be referred to by like numerals:

FIGS. 2A-2E depict exemplary profile models;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
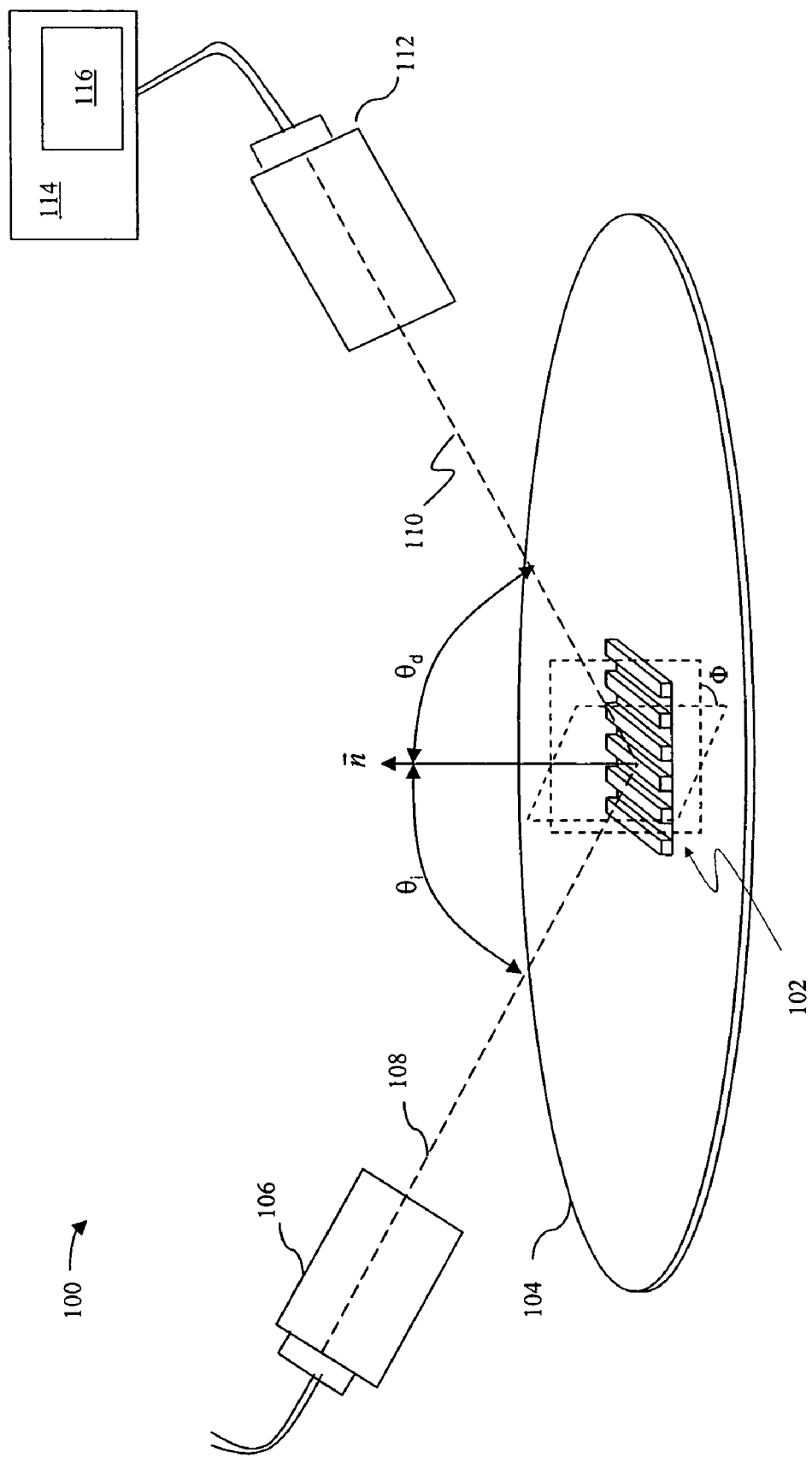
FIG. 1 depicts an exemplary optical metrology system.

With reference to FIG. 1, an optical metrology system 100 can be used to examine and analyze a structure on a semiconductor wafer. For example, optical metrology system 100 can be used to determine a feature of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104. Furthermore, in some applications, the device can be measured directly.

As depicted in FIG. 1, optical metrology system 100 can include an optical metrology device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal, which can include reflectance, tan ($\Psi$), cos ($\Delta$), Fourier coefficients, and the like.

Optical metrology system 100 also includes a processing module 114 configured to receive the measured diffraction signal and analyze the measured diffraction signal. As described below, a feature of periodic grating 102 can then be determined using a library-based process or a regression-based process. Additionally, other linear or non-linear profile model extraction techniques are contemplated.

2. Library-Based Process

In a library-based process, the measured diffraction signal is compared to a library of simulated diffraction signals. More specifically, each simulated diffraction signal in the library is associated with a profile model of the structure. When a match is made between the measured diffraction signal and one of the simulated diffraction signals in the library or when the difference of the measured diffraction signal and one of the simulated diffraction signals in the library is within a preset or matching criterion, the profile model associated with the matching simulated diffraction signal in the library is presumed to represent the actual profile of the structure. A feature of the structure can then be determined based on the profile model associated with the matching simulated diffraction signal.

Thus, with reference again to FIG. 1, in one exemplary embodiment, after obtaining a measured diffraction signal, processing module 114 compares the measured diffraction signal to simulated diffraction signals stored in a library 116. Each simulated diffraction signal in library 116 is associated with a profile model. When a match is made between the measured diffraction signal and one of the simulated diffraction signals in library 116, the profile model associated with the matching simulated diffraction signal in library 116 can be presumed to represent the actual profile of periodic grating 102.

The set of profile models stored in library 116 can be generated by characterizing a profile model using a set of profile parameters, then varying the set of profile parameters to generate profile models of varying shapes and dimensions. The process of characterizing a profile model using a set of profile parameters can be referred to as parameterizing.

For example, as depicted in FIG. 2A, assume that profile model 200 can be characterized by profile parameters h1 and w1 that define its height and width, respectively. As depicted in FIGS. 2B to 2E, additional shapes and features of profile model 200 can be characterized by increasing the number of profile parameters. For example, as depicted in FIG. 2B, profile model 200 can be characterized by profile parameters h1, w1, and w2 that define its height, bottom width, and top width, respectively. Note that the width of profile model 200 can be referred to as the critical dimension (CD). For example, in FIG. 2B, profile parameter w1 and w2 can be described as defining the bottom CD and top CD, respectively, of profile model 200. It should be recognized that various types of profile parameters can be used to characterize profile model 200, including angle of incident (AOI), pitch, n & k, hardware parameters (e.g., polarizer angle), and the like.

As described above, the set of profile models stored in library 116 (FIG. 1) can be generated by varying the profile parameters that characterize the profile model. For example, with reference to FIG. 2B, by varying profile parameters h1, w1, and w2, profile models of varying shapes and dimensions can be generated. Note that one, two, or all three profile parameters can be varied relative to one another.

Thus, the profile parameters of the profile model associated with a matching simulated diffraction signal can be used to determine a feature of the structure being examined. For example, a profile parameter of the profile model corresponding to a bottom CD can be used to determine the bottom CD of the structure being examined.

With reference again to FIG. 1, the number of profile models and corresponding simulated diffraction signals in the set of profile models and simulated diffraction signals stored in library 116 (i.e., the resolution and/or range of library 116) depends, in part, on the range over which the set of profile parameters and the increment at which the set of profile parameters are varied. In one exemplary embodiment, the profile models and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscopy (AFM), scanning electron microscopy (SEM), and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process

In a regression-based process, the measured diffraction signal is compared to a simulated diffraction signal generated prior to the comparison (i.e., a trial simulated diffraction signal) using a set of profile parameters (i.e., trial profile parameters) for a profile model. If the measured diffraction signal and the trial simulated diffraction signal do not match or when the difference of the measured diffraction signal and the trial simulated diffraction signal is not within a preset or matching criterion, another trial simulated diffraction signal is generated using another set of profile parameters for another profile model, then the measured diffraction signal and the newly generated trial simulated diffraction signal are compared. When the measured diffraction signal and the trial simulated diffraction signal match or when the difference of the measured diffraction signal and the trial simulated diffraction signals is within a preset or matching criterion, the profile model associated with the matching trial simulated diffraction signal is presumed to represent the actual profile of the structure. The profile model associated with the matching trial simulated diffraction signal can then be used to determine a feature of the structure being examined.

Thus, with reference again to FIG. 1, in one exemplary embodiment, processing module 114 can generate a trial simulated diffraction signal for a profile model, and then compare the measured diffraction signal to the trial simulated diffraction signal. As described above, if the measured diffraction signal and the trial simulated diffraction signal do not match or when the difference of the measured diffraction signal the trial simulated diffraction signals is not within a preset or matching criterion, then processing module 114 can iteratively generate another trial simulated diffraction signal for another profile model. In one exemplary embodiment, the subsequently generated trial simulated diffraction signal can be generated using an optimization algorithm, such as global optimization techniques, which includes simulated annealing, and local optimization techniques, which includes steepest descent algorithm.

In one exemplary embodiment, the trial simulated diffraction signals and profile models can be stored in a library 116 (i.e., a dynamic library). The trial simulated diffraction signals and profile models stored in library 116 can then be subsequently used in matching the measured diffraction signal. Alternatively, library 116 can be omitted from optical metrology system 100.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Selecting Optimal Profile Model

The accuracy, complexity, and length of time needed to perform a library-based process and/or regression-based process depends, in part, on the complexity of the profile model used. For example, increasing the complexity of the profile model by adding a profile parameter can increase accuracy. However, the increased complexity of the profile model can increase the complexity and the amount of time needed to perform the library-based process and/or regression-based process. Thus, with reference to FIG. 3, in one exemplary embodiment, an optimal profile model to be used in a library-based process and/or regression-based process is selected using exemplary process 300.

In step 302, a measured diffraction signal is obtained. In the present exemplary embodiment, the measured diffraction signal from a structure to be examined is obtained using an optical metrology device, such as a reflectometer, ellipsometer, and the like. Note that the structure used to obtain the measured diffraction signal can be the actual structure to be examined or a representative structure of the actual structure to be examined.

In step 304, an initial profile model is obtained. The initial profile model has a set of profile parameters that characterize the structure to be examined. In the present exemplary embodiment, the initial profile model is the most complex profile model that will be used in process 300, and eventually the library-based process and/or regression-based process. Thus, if process 300 is iterated, progressively simpler profile models are used in iterating process 300. For example, the initial profile model used in the first iteration of process 300 can include six profile parameters. If process 300 is iterated, the profile model used in the second iteration of process can be simplified to include five profile parameters. In the present exemplary embodiment, the initial profile model can be selected by a user or can be automatically selected using a default profile model.

In step 306, a machine learning system is trained using the initial profile model. With reference to FIG. 1, in one exemplary embodiment, the machine learning system employs a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

Figure 4:
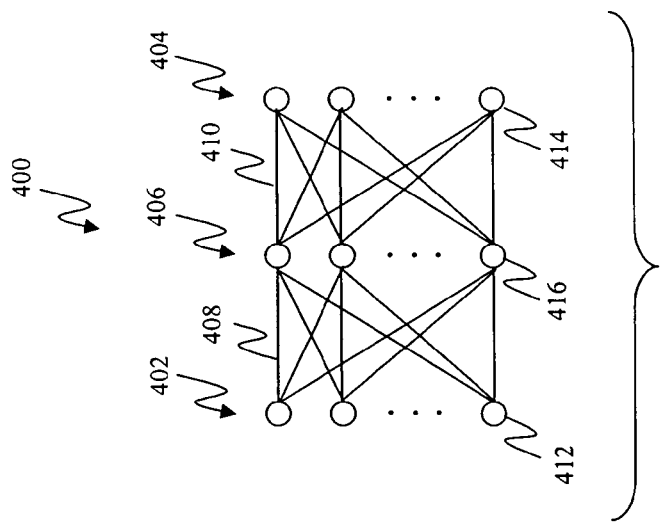
FIG. 4 depicts an exemplary neural network.

With reference to FIG. 4, in one exemplary implementation, the machine learning system is a neural network 400 using a back-propagation algorithm. Neural network 400 includes an input layer 402, an output layer 404, and a hidden layer 406 between input layer 402 and output layer 404. Input layer 402 and hidden layer 406 are connected using links 408. Hidden layer 406 and output layer 404 are connected using links 410. It should be recognized, however, that neural network 400 can include any number of layers connected in various configurations.

As depicted in FIG. 4, input layer 402 includes one or more input nodes 412. In the present exemplary implementation, an input node 412 in input layer 402 corresponds to a profile parameter of the profile model that is inputted into neural network 400. Thus, the number of input nodes 412 corresponds to the number of profile parameters used to characterize the profile model. For example, if a profile model is characterized using two profile parameters (e.g., top and bottom critical dimensions), input layer 402 includes two input nodes 412, where a first input node 412 corresponds to a first profile parameter (e.g., a top critical dimension) and a second input node 412 corresponds to a second profile parameter (e.g., a bottom critical dimension).

In neural network 400, output layer 404 includes one or more output nodes 414. In the present exemplary implementation, each output node 414 is a linear function. It should be recognized, however, that each output node 414 can be various types of functions. Additionally, in the present exemplary implementation, an output node 414 in output layer 404 corresponds to a dimension of the simulated diffraction signal that is outputted from neural network 400. Thus, the number of output nodes 414 corresponds to the number of dimensions used to characterize the simulated diffraction signal. For example, if a simulated diffraction signal is characterized using five dimensions corresponding to, for example, five different wavelengths, output layer 404 includes five output nodes 414, wherein a first output node 414 corresponds to a first dimension (e.g., a first wavelength), a second output node 414 corresponds to a second dimension (e.g., a second wavelength), etc. Additionally, for increased performance, neural network 400 can be separated into a plurality of sub networks based on separate components of the simulated diffraction signal and/or dimensions of the components of the simulated diffraction signal.

In neural network 400, hidden layer 406 includes one or more hidden nodes 416. In the present exemplary implementation, each hidden node 416 is a sigmoidal transfer function or a radial basis function. It should be recognized, however, that each hidden node 416 can be various types of functions. Additionally, in the present exemplary implementation, the number of hidden nodes 416 is determined based on the number of output nodes 414. More particularly, the number of hidden nodes 416($m$) is related to the number of output nodes 414($n$) by a predetermined ratio ($r=m/n$). For example, when $r=10$, there are 10 hidden nodes 416 for each output node 414. It should be recognized, however, that the predetermined ratio can be a ratio of the number of output nodes 414 to the number of hidden nodes 416 (i.e., $r=n/m$). Additionally, it should be recognized that the number of hidden nodes 416 in neural network 400 can be adjusted after the initial number of hidden nodes 416 is determined based on the predetermined ratio. Furthermore, the number of hidden nodes 416 in neural network 400 can be determined based on experience and/or experimentation rather than based on the predetermined ratio.

Figure 5:
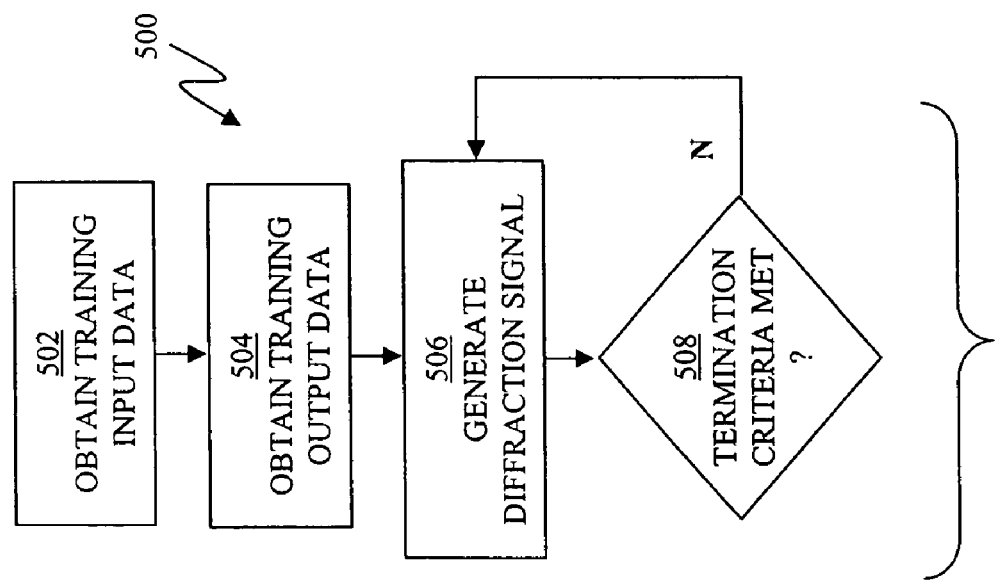
FIG. 5 depicts an exemplary process of training a machine learning system.

With reference to FIG. 5, an exemplary process 500 is depicted for training a machine learning system. In exemplary process 500, the machine learning system is trained using a set of training input data and a set of training output data, where an input data in the set of training input data has a corresponding output data in the set of training output data to form an input and an output data pair.

In step 502, the set of training input data is obtained. In the present exemplary embodiment, the training input data includes a set of profile models generated based on the initial profile model. More particularly, the set of profile models is generated by varying one or more profile parameters that characterize the initial profile model, either alone or in combination. The one or more profile parameters are varied over one or more ranges based on the expected range of variability in the actual profile of the structure to be examined, the expected range of variability is determined either empirically or through experience. For example, if the actual profile of the structure to be examined is expected to have a bottom critical dimension that can vary between $x_1$ and $x_2$, then the set of profile models used as the training input data can be generated by varying the profile parameter in the initial profile model corresponding to the bottom critical dimension between $x_1$ and $x_2$.

In step 504, the set of training output data is obtained. In the present exemplary embodiment, the training output data includes a set of diffraction signals. A diffraction signal in the set of diffraction signals used as the training output data corresponds to a profile model in the set of profile models used as the training input data. Each diffraction signal in the set of diffraction signals can be generated based on each profile model in the set of profile models using a modeling technique, such as rigorous coupled wave analysis (RCWA), integral method, Fresnel method, finite analysis, modal analysis, and the like. Alternatively, each diffraction signal in the set of diffraction signals can be generated based on each profile model in the set of profile models using an empirical technique, such as measuring a diffraction signal using an optical metrology device, such as an ellipsometer, reflectometer, atomic force microscope (AFM), scanning electron microscope (SEM), and the like. Thus, a profile model from the set of profile models and the corresponding diffraction signal from the set of diffraction signals form a profile model/diffraction signal pair. Although there is a one-to-one correspondence between a profile model and a diffraction signal in the profile model/diffraction signal pair, note that there does not need to be a known relation, either analytic or numeric, between the profile model and the diffraction signal in the profile model/diffraction signal pair.

In step 506, simulated diffraction signals are generated with the machine learning system using the training input data as inputs to the machine learning system. In step 508, a determination is made as to whether one or more termination criteria are met. In the present exemplary embodiment, a termination criterion can be based on an analysis of the diffraction signals (i.e., the diffraction signals in the training output data and the simulated diffraction signals generated by the machine learning system), such as a cost function value, a Goodness-of-Fit (GOF) value, various curve fitting metrics, and the like. Alternatively or additionally, a termination criterion can be based on an analysis of the profile models, such as correlation, sensitivity, confidence interval, and the like. It should be recognized that the determination made in step 508 can be based on a combination of any two or more termination criteria.

A cost function determined between two diffraction signals is illustrated by the equations below, where $V_1$ and $V_2$ are two vectors of size n, and the cost function of $V_1$ relative to $V_2$ is:

$$\text{Cost}(V_1, V_2) = \left( \sum_{i=1}^{n} (V_{1i} - V_{2i})^p \right)^{\frac{1}{p}}$$

where i represents the ith member of the vector and p is an arbitrary number associated with the metric. The first vector is the set of signal values for a first diffraction signal, and the second vector is the corresponding set of signal values for a second diffraction signal.

A goodness of fit (GOF) is a measure of the proximity of two sets values. For example, when ellipsometric measurements are used, GOF can be determined based on values for tan ψ and cos Δ, where tan ψ and cos Δ are represented by a single vector of n dimensions:

$$S = [\tan \psi_1 \tan \psi_2 \ldots \tan \psi_{n/2} \cos \Delta_1 \cos \Delta_2 \ldots \cos \Delta_n]$$

One commonly used formula for GOF between a first signal $S_1$ compared to a second signal $S_2$ is:

$$GOF = 1 - \frac{\sum_{i}^{n} (S_2(i) - S_1(i))^2}{\sum_{i}^{n} (S_1(i) - \overline{S_1})^2}$$

where $$\overline{S_1} = \frac{\sum_{i}^{n} S_1(i)}{n}$$

where i represents the ith point for comparison, n is the total number of points of comparison.

A correlation coefficient, r, between two profile parameters can be calculated using the formula:

$$r = \frac{\sum_{i} (x_i - \overline{x})(y_i - \overline{y})}{\sqrt{\sum_{i} (x_i - \overline{x})^2 \sum_{i} (y_i - \overline{y})^2}}$$

where $x_i$ and $y_i$ is a pair of profile parameters, $\overline{x}$ is the mean of $x_i$'s and $\overline{y}$ is the mean of $y_i$'s. The value of r lies between −1 and +1 inclusive. A correlation coefficient value of +1 can correspond to complete positive correlation and a value of −1 can correspond to complete negative correlation. A value of r close to zero can correspond to the x and y profile parameters not being correlated.

A sensitivity of a diffraction signal to changes in one or more profile parameters can be determined by changing one profile parameter by a small amount and keeping the other profile parameters constant. For example, the sensitivity of profile parameter x0 may be tested by adding one nanometer to the nominal value while keeping profile parameters x1, x2, and x3 at nominal value. If there is no noticeable change in the diffraction signal (x0 at nominal plus 1 nm), then x0 has low sensitivity. The other profile parameters can similarly be changed while holding the rest constant in order to test the sensitivity of each profile parameter.

The sensitivity of a profile parameter may be quantitatively expressed by calculating the sum-square-error (SSE) of the changed diffraction signal compared to the diffraction signal using nominal values. The SSE formula is as follows:

$$SSE = \sum_{i=1}^{n} (S_o(i) - S_1(i))^2$$

where i is the signal point, typically at a preset wavelength, n is the number of signal points, $S_0$ is the diffraction signal value using nominal values of profile parameters, $S_1$ is the diffraction signal value using nominal plus change in one of the profile parameters.

A confidence interval of a profile parameter can be determined by the amount of change from a nominal value of the profile parameter, where the change in the diffraction signals is greater than the noise level. The noise in the diffraction signals may be due to system noise, for example, noise from the measurement devices, or the noise may be simulated. The confidence interval is generally expressed as a multiple of the standard deviation sigma, σ, of the profile parameter. The standard deviation for a profile parameter can be calculated from measured values of the profile parameter, using the formula:

$$\sigma = \sqrt{(([1/(N-1)]) * (x_i - x_{av})^2)}$$

where N is the number of measurements, $x_i$ is the ith value of the profile parameter x, and $x_{av}$ is the average value of the profile parameter x. In the present exemplary embodiment, a confidence interval of 3 sigmas can be used.

The confidence interval is typically calculated from a given set of sample input data representing actual measurements off the wafer structure. The confidence interval may also be calculated using simulated random noise introduced in the measurement data for the profile parameter.

As depicted in FIG. 5, if the one or more termination criteria are not met, step 506 is repeated. In the present exemplary embodiment, before repeating step 506, the machine learning system is adjusted. For example, when the machine learning system is a neural network, the weights used in the functions or the number of hidden nodes of the neural network can be adjusted. After adjusting the machine learning system, step 506 is repeated to generate diffraction signals using the training input data as inputs to the adjusted machine learning system. Alternatively or additionally, a new set of training input and output data can be obtained, and then diffraction signals are generated using the new training input data as inputs to the machine learning system.

It should be recognized that training process 500 can include the use of an optimization technique, such as gradient descent, linear programming, quadratic programming, simulated annealing, Marquardt-Levenberg algorithm, and the like. Additionally, training process 500 is depicted as batch training, where diffraction signals are generated for all of the profile models in the training input data as a batch. For a more detailed description of batch training, see "Neural Networks" by Simon Haykin, which has been cited above. It should be recognized, however, that a diffraction signal can be generated for each of the profile models in the training input data one at a time.

Furthermore, training process 500 depicted in FIG. 5 illustrates a back-propagation algorithm. However, it should be recognized that various training algorithms can be used, such as radial basis network, support vector, kernel regression, and the like.

Figure 6:
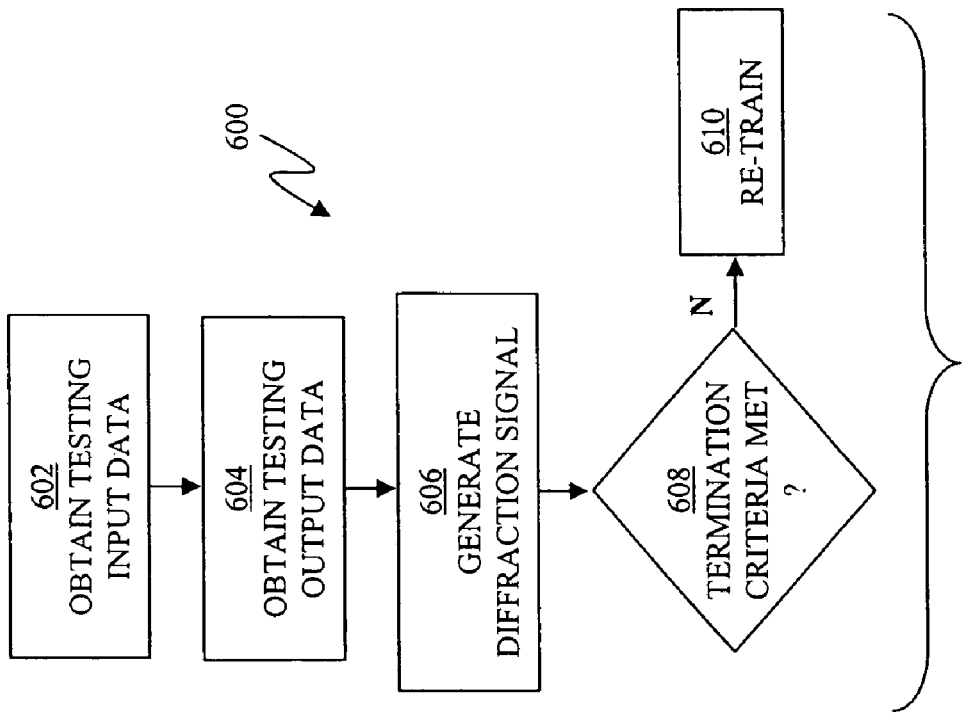
FIG. 6 depicts an exemplary process of testing a machine learning system.

With reference to FIG. 6, an exemplary process 600 is depicted for testing a machine learning system. In the present exemplary embodiment, after a machine learning system has been trained, the machine learning system can be tested to confirm that it has been properly trained. It should be recognized, however, that this testing process can be omitted in some applications.

In 602, a set of testing input data is obtained. In 604, a set of testing output data is obtained. In the present exemplary embodiment, the testing input data includes a set of profile models, and the testing output data includes a set of diffraction signals. The set of testing input data and set of testing output data can be obtained using the same process and techniques described above during the training process. The set of testing input data and set of testing output data can be the same as or a subset of the training input data and training output data. Alternatively, the set of testing input data and set of testing out data can be different than the training input data and training output data.

In 606, simulated diffraction signals are generated with the machine learning system using the testing input data as inputs to the machine learning system. In 608, a determination is made as to whether one or more termination criteria are met. In the present exemplary embodiment, a termination criterion can be based on an analysis of simulated diffraction signals (i.e., the simulated diffraction signals in the training output data and the simulated diffraction signals generated by the machine learning system), such as a cost function value, a Goodness-of-Fit (GOF) value, various curve fitting metrics, and the like. Alternatively or additionally, a termination criterion can be based on an analysis of the profile models, such as correlation, sensitivity, confidence interval, and the like. It should be recognized that the determination made in 608 can be based on a combination of any two or more termination criteria.

In 610, if the one or more termination criteria are not met, the machine learning system is re-trained. When the machine learning system is re-trained, the machine learning system can be adjusted. For example, when the machine learning system is a neural network, the weights used in the functions or the number of hidden nodes of the neural network can be adjusted. Alternatively or additionally, the selection and number of the training input and output variables can be adjusted.

Figure 7:
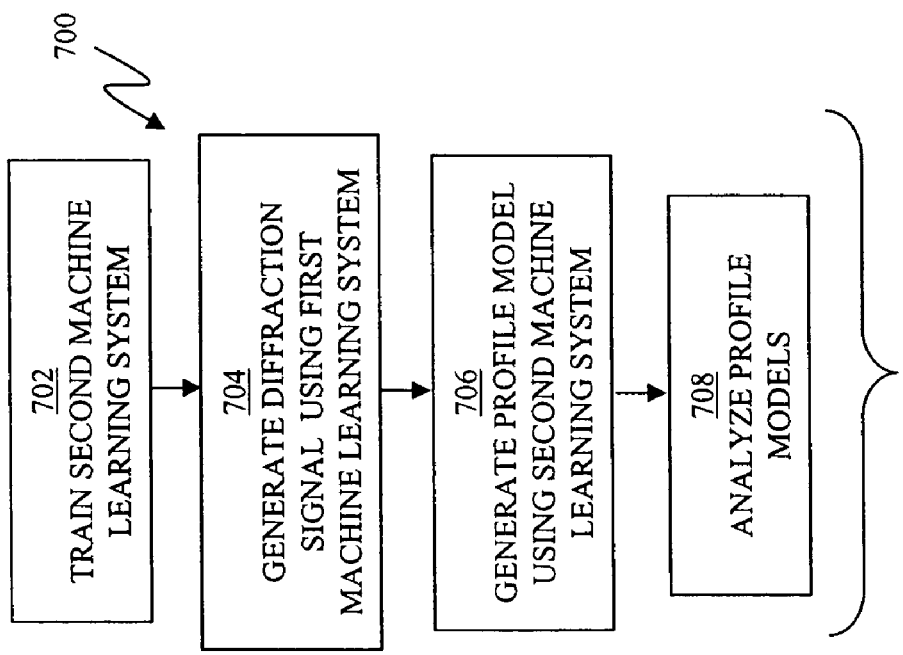
FIG. 7 depicts another exemplary process of testing a machine learning system.

With reference to FIG. 7, another exemplary process 700 is depicted for testing or validating a machine learning system. In the present exemplary embodiment, a first machine learning system can be tested or validated by training a second machine learning system.

In step 702, the second machine learning system is trained using the same set of training data used to train the first machine learning system. However, the training input data used in training the first machine learning system is used as the training output data in training the second machine learning system, and the training output data used in training the first machine learning system is used as the training input data in training the second machine learning system. Thus, when the first machine learning system is trained using profile models as inputs and diffraction signals as outputs, the second machine learning system is trained using diffraction signals as inputs and profile models as outputs.

After the second machine learning system has been trained, in step 704, one or more profile models are used as inputs to generate one or more simulated diffraction signals using the first machine learning system. In step 706, the one or more simulated diffraction signals generated by the first machine learning system are used as inputs to generate one or more profile models using the second machine learning system.

In step 708, the one or more profile models generated by the second machine learning system and the one or more profile models that were used as inputs into the first machine learning system can be analyzed. For example, if the difference between the profile models is within an acceptable tolerance, the first machine learning system is validated.

An empirical risk minimization (ERM) technique can be used to quantify how well the trained machine learning system can generalize to new input. For a more detailed description of ERM, see "Statistical Learning Theory" by Vladimir N. Vapnik, Wiley-Interscience, September 1998, which is incorporated herein by reference in its entirety.

With reference again to FIG. 3, after the machine learning system has been trained using the initial profile model, in step 308, the machine learning system is used to generate a simulated diffraction signal for an optimized profile model. In the present exemplary embodiment, the optimized profile model has a set of profile parameters with the same or fewer profile parameters than the initial profile parameter. Note that the optimized profile model can be the same as the initial profile model in the first iteration of process 300.

In step 310, a determination is made as to whether one or more termination criteria are met. In the present exemplary embodiment, a termination criterion can be based on an analysis of simulated diffraction signals (i.e., the simulated diffraction signals in the training output data and the simulated diffraction signals generated by the machine learning system), such as a cost function value, a Goodness-of-Fit (GOF) value, various curve fitting metrics, and the like. Alternatively or additionally, a termination criterion can be based on an analysis of the profile models, such as correspondence, correlation, sensitivity, confidence interval, and the like. It should be recognized that the determination made in 310 can be based on a combination of any two or more termination criteria.

In the present exemplary embodiment, when cost function is included as a termination criterion, a cost function value can be determined between the simulated diffraction signal and the measured diffraction signal. The determined cost function can then be compared to a preset cost function value to determine if the determined cost function value is less than or equal to the preset cost function value. The preset cost function value may be set at a specific number, for example, 0.05.

When GOF value is included as a termination criterion, a GOF value can be determined between the simulated diffraction signal and the measured diffraction signal. The determined GOF value can then be compared to a preset GOF value to determine if the determined GOF value is less than or equal to the preset GOF value. The preset GOF value may be set at a specific number, for example 0.95.

When correspondence is included as a termination criterion, a correspondence is obtained between the profile parameters of the optimized profile model and the dimensions of the actual profile that corresponds to the measured diffraction signal. In the present exemplary embodiment, the dimensions of the actual profile can be obtained using SEM.

When correlation is included as a termination criterion, a correlation coefficient can be determined between a pair of profile parameters of the optimized profile model. The determined correlation coefficient can then be compared to a preset correlation coefficient to determine if the determined correlation coefficient is less than or equal to the preset correlation coefficient.

When parameter sensitivity is included as a termination criterion, a sensitivity can be determined for each profile parameter of the optimized profile model. The determined sensitivity can then be compared to a preset sensitivity to determine if the determined sensitivity is less than or equal to the preset sensitivity coefficient.

When confidence interval is included as a termination criterion, a confidence interval is determined for each profile parameter of the optimized profile model. The determined confidence interval can then be compared to a preset confidence interval to determine if the determined confidence interval is less than or equal to the preset confidence interval. The preset confidence interval may be set to any number of sigma, such as three-sigma.

In step 312, if the one or more termination criteria are not met, the optimized profile model is modified and steps 308 and 310 are iterated. In the present exemplary embodiment, the optimized profile model is modified to reduce the number of profile parameters used to characterize the optimized profile model used in iterating step 308.

Figure 3:
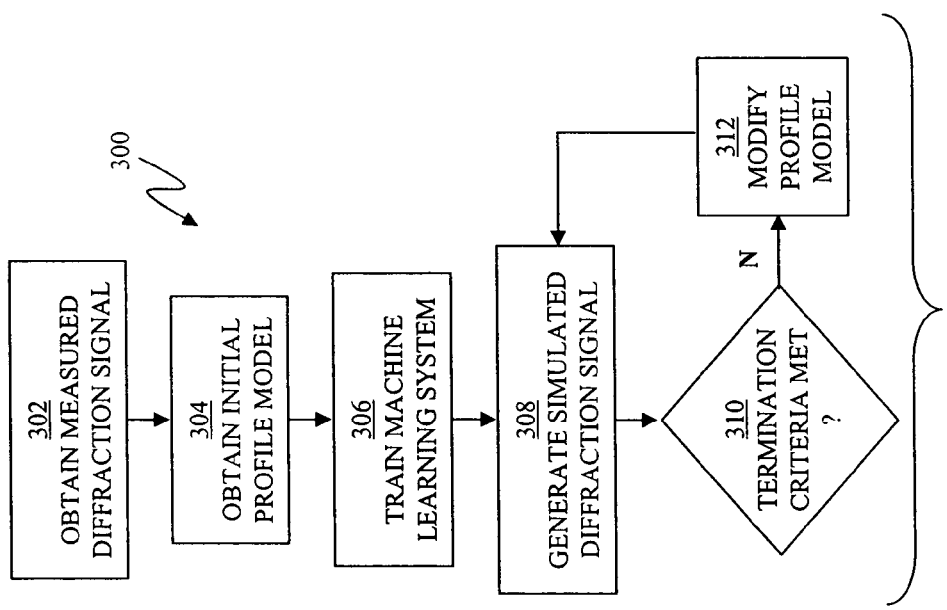
FIG. 3 depicts an exemplary process of selecting a profile model.
Figure 8:
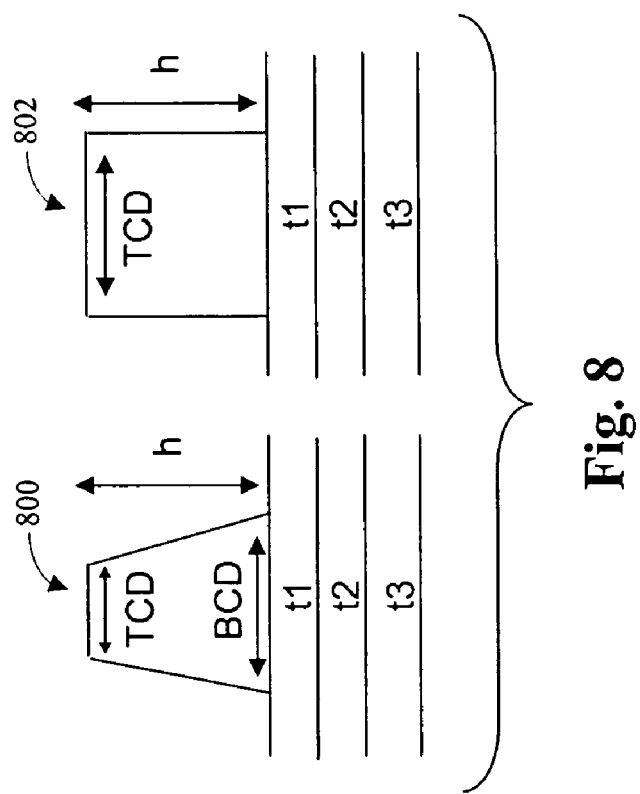
FIG. 8 depicts two exemplary profile models.

For example, with reference to FIG. 8, assume that in a first iteration of step 308 (FIG. 3), optimized profile model 800 was used. As depicted in FIG. 8, optimized profile model 800 is characterized by six profile parameters (i.e., thickness of a first thin film layer (t1), thickness of a second thin film layer (t2), thickness of a third thin film layer (t3), bottom critical dimension (BCD), a top critical dimension (TCD), and a height (h)). In step 312 (FIG. 3), assume that optimized profile model 800 is modified as optimized profile model 802 by eliminating the bottom critical dimension (BCD). Optimized profile model 802 is then used in iterating step 308 (FIG. 3).

With reference again to FIG. 3, in performing step 312, a user can specify the modification to the optimized profile model. For example, selection of the profile parameter to be eliminated is one way to specify the modification to the optimized profile model. Alternatively, the selection of the profile parameter to be eliminated can be made using one or more selection criteria, such as correlation, sensitivity, confidence interval, and the like.

For additional examples of profile model selection processes, see U.S. patent application Ser. No. 10/206,491, titled MODEL AND PARAMETER SELECTION FOR OPTICAL METROLOGY, filed on Jul. 25, 2002, which is incorporated herein by reference in its entirety. See also U.S. patent application Ser. No. 10/397,631, titled OPTIMIZED MODEL AND PARAMETER SELECTION FOR OPTICAL METROLOGY, filed on Mar. 25, 2003, which is incorporated herein by reference in its entirety.

With reference again to FIG. 3, in the present exemplary embodiment, in iterating step 308, the same machine learning system is used. Because the optimized profile model used in generating the simulated diffraction signal in step 308 includes the same or fewer profile parameters than the initial profile model used to train the machine learning system in step 302, the machine learning system does not need to be retrained, which reduces the amount of time to generate the simulated diffraction signal in step 308.

In the exemplary embodiment, after selecting an optimized profile model using process 300, a profile refinement process can be used to select at least one profile parameter of the optimized profile model and set the at least one profile parameter to a determined value. The at least one profile parameter can be selected using one or more selection criteria, such as correlation, fabrication process knowledge, historical information, the ability to obtain measurements from metrology tools, and the like. The determined value for the at least one profile parameter can be obtained from a variety of sources, such as specific measurements of the at least one profile parameter, profile extraction, theoretical and/or empirical data, estimates based on simulations of fabrication recipes using semiconductor fabrication simulation systems, mathematical and/or statistical techniques, averaging techniques, and the like.

For example, assume a selection criteria includes a correlation of at least 0.95 or higher. Now assume that an optimized profile model includes a width parameter and a thickness parameter with a correlation greater than 0.95. Thus, in this example, the width parameter and/or the thickness parameter is selected and set to a determined value.

Assume that the thickness parameter in the example above is selected. Now assume that the determined value is obtained using an averaging technique. More particularly, in the present example, multiple thickness measurements of the selected thickness parameter on a wafer are obtained. An average thickness measurement of the selected thickness parameter is then calculated from the multiple thickness measurements. The selected thickness parameter is then set to the average thickness measurement.

Note that when a profile refinement process is used with a machine learning system, a selected profile parameter can be set to any value. However, when a profile process is used with a library-based system, a selected profile parameter is preferably set based on a constraint of the library, such as the resolution of the library. For example, if a profile process is used with a machine learning system and an average thickness measurement is 50.25 nanometers, then the selected thickness parameter can be set to 50.25 nanometers. However, if a profile process is used with a library-based system and the library includes thickness parameters at intervals of 50, 55, and 60 nanometers, then the selected thickness parameter is set to 50 nanometers.

For a more detailed description of a profile refinement process, see U.S. patent application Ser. No. 10/735,212, titled PARAMETRIC OPTIMIZATION OF OPTICAL METROLOGY MODEL, filed on Dec. 12, 2003, which is incorporated herein by reference in its entirety.

Although exemplary embodiments have been described, various modifications can be made without departing from the spirit and/or scope of the present invention. Therefore, the present invention should not be construed as being limited to the specific forms shown in the drawings and described above.

We claim:

1. A method of selecting a profile model for use in examining a structure formed on a semiconductor wafer using optical metrology, the method comprising:
   a) obtaining an initial profile model having a set of profile parameters that characterize the structure to be examined;
   b) training a machine learning system using the initial profile model;
   c) generating a simulated diffraction signal for an optimized profile model using the trained machine learning system, wherein the optimized profile model has a set of profile parameters with the same or fewer profile parameters than the initial profile model; and
   d) modifying the optimized profile model by eliminating at least one profile parameter or fixing to a value at least one profile parameter and iterating steps c) and d) using the modified optimized profile model and the same trained machine learning system until one or more termination criteria are met.

2. The method of claim 1, further comprising:
   obtaining a measured diffraction signal from an optical metrology device; and
   analyzing the simulated diffraction signal and the measured diffraction signal.

3. The method of claim 2, wherein the one or more termination criteria includes a cost function value determined based on the analysis of the simulated and measured diffraction signals.

4. The method of claim 2, wherein the one or more termination criteria includes a preset goodness of fit (GOF) value determined based on the analysis of the simulated and measured diffraction signals.

5. The method of claim 1, further comprising:
   obtaining a measured diffraction signal from an optical metrology device; and
   obtaining a profile associated with the measured diffraction signal, wherein the one or more termination criteria includes parameter correspondence determined between the profile parameters of the optimized profile model and dimensions of the profile associated with the measured diffraction signal.

6. The method of claim 1, wherein the one or more termination criteria includes a correlation coefficient determined between a pair of profile parameters of the optimized profile model.

7. The method of claim 1, wherein the one or more termination criteria includes a sensitivity determined for a profile parameter of the optimized profile model.

8. The method of claim 1, wherein step b) comprises:
   training a first machine learning system using a set of training input data and a set of training output data, wherein each of the training input data is a profile model having a set of profile parameters with the same profile parameters as the initial profile model, and wherein each of the training output data is a diffraction signal.

9. The method of claim 8, wherein the set of training output data is generated based on the set of training input data using a modeling technique prior to training the first machine learning system.

10. The method of claim 9, wherein the modeling technique includes rigorous coupled wave analysis, integral method, Fresnel method, finite analysis, or modal analysis.

11. The method of claim 8, wherein training the first machine learning system comprises:
    e) obtaining training input data;
    f) generating a diffraction signal with the first machine learning system using the training input data;
    g) determining if one or more termination criteria are met; and
    h) if the one or more termination criteria are not met, iterating steps f) to h).

12. The method of claim 11, further comprising:
    when iterating steps f) to h), adjusting the machine learning system or using new training input data in step g).

13. The method of claim 8, further comprising:
    testing the first machine learning system using a second machine learning system.

14. The method of claim 13, further comprising:
    before testing the first machine learning system, training the second machine learning system using the training input data for the first machine learning system as training output data for the second machine learning system, and the training output data for the first machine learning system as training input data for the second machine learning system.

15. The method of claim 14, further comprising:
    after training the second machine learning system,
        generating one or more simulated diffraction signals using one or more profile models as inputs to the first machine learning system;
        generating one or more profile models using the one or more simulated diffraction signals generated by the first machine learning system as inputs to the second machine learning system; and
        analyzing the one or more profile models generated by the second machine learning system and the one or more profile models used as inputs to the first machine learning system.

16. The method of claim 1, wherein the machine learning system is a neural network.

17. The method of claim 1, wherein the optical metrology device is an ellipsometer or reflectometer.

18. The method of claim 1, wherein the one or more profile parameters includes one or more of critical dimension measurements, angle of incidence, n and k values, or pitch.

19. The method of claim 1, further comprising:
    if one or more termination criteria are met,
        selecting at least one profile parameter of the optimized profile model; and
        setting the at least one profile parameter to a determined value.

20. The method of claim 19, wherein the at least one profile parameter includes a thickness parameter, and wherein the determined value includes an average thickness measurement.

21. A computer-readable storage medium containing computer executable instructions for causing a computer to select a profile model for use in examining a structure formed on a semiconductor wafer using optical metrology, comprising instructions for:

a) obtaining an initial profile model having a set of profile parameters that characterize the structure to be examined;

b) training a machine learning system using the initial profile model;

c) generating a simulated diffraction signal for an optimized profile model using the trained machine learning system, wherein the optimized profile model has a set of profile parameters with the same or fewer profile parameters than the initial profile model;

d) modifying the optimized profile model by eliminating at least one profile parameter or fixing to a value at least one profile parameter and iterating steps c) and d) using the modified optimized profile model and the same trained machine learning system until one or more termination criteria are met.

22. The computer-readable storage medium of claim 21, further comprising:

obtaining a measured diffraction signal from an optical metrology device; and analyzing the simulated diffraction signal and the measured diffraction signal.

23. The computer-readable storage medium of claim 22, wherein the one or more termination criteria includes a cost function value determined based on the analysis of the simulated and measured diffraction signals.

24. The computer-readable storage medium of claim 22, wherein the one or more termination criteria includes a goodness of fit (GOF) value determined based on the analysis of the simulated and measured diffraction signals.

25. The computer-readable storage medium of claim 21, further comprising:

obtaining a measured diffraction signal from an optical metrology device; and obtaining a profile associated with the measured diffraction signal, wherein the one or more termination criteria includes parameter correspondence determined between the profile parameters of the optimized profile model and dimensions of the profile associated with the measured diffraction signal.

26. The computer-readable storage medium of claim 21, wherein the one or more termination criteria includes a correlation coefficient determined between a pair of profile parameters of the optimized profile model.

27. The computer-readable storage medium of claim 21, wherein the one or more termination criteria includes a sensitivity determined for a profile parameter of the optimized profile model.

28. The computer-readable storage medium of claim 21, wherein step b) comprises:

training a first machine learning system using a set of training input data and a set of training output data, wherein each of the training input data is a profile model having a set of profile parameters with the same profile parameters as the initial profile model, and wherein each of the training output data is a diffraction signal.

29. The computer-readable storage medium of claim 28, wherein the set of training output data is generated based on the set of training input data using a modeling technique prior to training the machine learning system.

30. The computer-readable storage medium of claim 28, further comprising:

testing the first machine learning system using a second machine learning system 31. The computer-readable storage medium of claim 30, further comprising:

before testing the first machine learning system, training the second machine learning system using the training input data for the first machine learning system as training output data for the second machine learning system and the training output data for the first machine learning system as training input data for the second machine learning system.

32. The computer-readable storage medium of claim 31, further comprising:

after training the second machine learning system, generating one or more simulated diffraction signals using one or more profile models as inputs to the first machine learning system;

generating one or more profile models using the one or more simulated diffraction signals generated by the first machine learning system as inputs to the second machine learning system; and analyzing the one or more profile models generated by the second machine learning system with the one or more profile models used as inputs to the first machine learning system.

33. The computer-readable storage medium of claim 21, further comprising:

if one or more termination criteria are met, selecting at least one profile parameter of the optimized profile model; and setting the at least one profile parameter to a determined value.

34. The computer-readable storage medium of claim 33, wherein the at least one profile parameter includes a thickness parameter, and wherein the determined value includes an average thickness measurement.

35. A system to select a profile model for use in examining a structure formed on a semiconductor wafer using optical metrology, the system comprising:

an optical metrology device configured to provide a measured diffraction signal;

a first machine learning system trained using an initial profile model having a set of profile parameters that characterize the structure to be examined, the first machine learning system configured to generate a simulated diffraction signal for an optimized profile model having a set of profile parameters with the same or fewer profile parameters than the initial profile model, wherein the optimized profile model is modified by selecting at least one profile parameter of the optimized profile model to eliminate or fix to a value and the first machine learning system generates another simulated diffraction signal using the modified optimized profile model.

36. The system of claim 35, wherein the one or more termination criteria includes a cost function value or a goodness of fit (GOF) value determined based on an analysis of the simulated and measured diffraction signals.

37. The system of claim 35, wherein a profile associated with the measured diffraction signal is obtained, and wherein the one or more termination criteria includes parameter correspondence determined between the profile parameters of the optimized profile model and dimensions of the profile associated with the measured diffraction signal.

38. The system of claim 35, wherein the one or more termination criteria includes a correlation coefficient determined between a pair of profile parameters of the optimized profile model.

39. The system of claim 35, wherein the one or more termination criteria includes a sensitivity determined for a profile parameter of the optimized profile model.

40. The system of claim 35, wherein the first machine learning system is trained using a set of training input data and a set of training output data, wherein each of the training input data is a profile model having a set of profile parameters with the same profile parameters as the initial profile model, and wherein each of the training output data is a diffraction signal.

41. The system of claim 40, further comprising:
a second machine learning system trained using the training input data for the first machine learning system as training output data for the second machine learning system, and the training output data for the first machine learning system as training input data for the second machine learning system.

42. The system of claim 41, wherein
one or more simulated diffraction signals are generated using one or more profile models as inputs to the first machine learning system;
one or more profile models are generated using the one or more simulated diffraction signals generated by the first machine learning system as inputs to the second machine learning system; and
the one or more profile models generated by the second machine learning system are compared with the one or more profile models used as inputs to the first machine learning system.

43. The system of claim 35, wherein the first machine learning system is a neural network.

44. The system of claim 35, wherein the optical metrology device is an ellipsometer or reflectometer.

45. The system of claim 35, wherein the one or more profile parameters includes one or more of critical dimension measurements, angle of incidence, n and k values, or pitch.

46. The system of claim 35, wherein if one or more termination criteria are met, at least one profile parameter of the optimized profile model is selected and set to a determined value.

47. The system of claim 46, wherein the at least one profile parameter includes a thickness parameter, and wherein the determined value includes an average thickness measurement.

* * * * *